(12) United States Patent
Wieland

(10) Patent No.: US 9,460,260 B2
(45) Date of Patent: Oct. 4, 2016

(54) ENHANCED STITCHING BY OVERLAP DOSE AND FEATURE REDUCTION

(71) Applicant: Marco Jan-Jaco Wieland, Delft (NL)

(72) Inventor: Marco Jan-Jaco Wieland, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 14/622,983

(22) Filed: Feb. 16, 2015

(65) Prior Publication Data

US 2015/0242563 A1 Aug. 27, 2015

Related U.S. Application Data

(60) Provisional application No. 61/942,636, filed on Feb. 21, 2014.

(51) Int. Cl.
*H01L 21/263* (2006.01)
*G06F 17/50* (2006.01)
(Continued)

(52) U.S. Cl.
CPC ........... *G06F 17/5081* (2013.01); *G03B 27/42* (2013.01); *G03F 1/78* (2013.01);
(Continued)

(58) Field of Classification Search
CPC .. G06F 17/5081; G03F 1/78; G03F 7/70475; H01L 21/263
USPC ............................................ 438/798; 716/51
See application file for complete search history.

(56) References Cited

U.S. PATENT DOCUMENTS

| | | | |
|---|---|---|---|
| 6,149,856 A | 11/2000 | Zemel et al. | |
| 6,982,135 B2 * | 1/2006 | Chang | G03B 27/42 430/311 |

(Continued)

FOREIGN PATENT DOCUMENTS

| | | |
|---|---|---|
| EP | 1 180 784 A2 | 2/2002 |
| WO | WO 2007 105939 A1 | 9/2007 |

(Continued)

OTHER PUBLICATIONS

Hiroshi Yamashita et al—Recent Progress in Electron-Beam Cell Projection Technology—Jpn J Appl Phys vol. 35 1996 pp. 6404-6414.*

(Continued)

*Primary Examiner* — Moazzam Hossain
(74) *Attorney, Agent, or Firm* — Hoyng Rock Monegier LLP; David P. Owen

(57) ABSTRACT

A method for processing exposure data (40) for exposing a pattern on a target (30) using a plurality of charged particle beams (24), the exposure data comprising pattern data (42) representing one or more features (60) to be written on the target (30) and exposure dose data (52) describing exposure dose of the charged particle beams. The method comprises setting one or more dose values of the exposure dose data (52) such that a sum of dose values corresponding to a position in an overlap area (36) of the target exceeds a maximum dose value for the non-overlap areas (38) of the target where adjacent sub-areas (34) do not overlap, and dividing the pattern data (42) into a plurality of sub-sections (44), each of the sub-sections comprising pattern data describing a part of the pattern to be written in a corresponding sub-area (34) of the target (30), wherein the pattern data (42) comprises overlap pattern data (46) describing a part of the pattern to be written in a corresponding overlap area (36) of the target where adjacent sub-areas (34) overlap, and processing the overlap pattern data (46) to reduce a size of one or more features described by the overlap pattern data.

22 Claims, 10 Drawing Sheets

(51) Int. Cl.
*G03F 1/78* (2012.01)
*G03F 7/20* (2006.01)
*H01J 37/317* (2006.01)
*G03B 27/42* (2006.01)
*H01J 37/302* (2006.01)

(52) U.S. Cl.
CPC ........ *G03F 7/2059* (2013.01); *G03F 7/70475* (2013.01); *H01J 37/3026* (2013.01); *H01J 37/3177* (2013.01); *H01L 21/263* (2013.01)

(56) References Cited

U.S. PATENT DOCUMENTS

| | | | |
|---|---|---|---|
| 7,091,504 | B2 | 8/2006 | Wieland et al. |
| 8,017,286 | B2 | 9/2011 | Fujimura et al. |
| 8,468,473 | B1 | 6/2013 | Wang et al. |
| 2004/0191643 | A1* | 9/2004 | Chang .................... G03B 27/42 430/5 |
| 2005/0211921 | A1 | 9/2005 | Wieland et al. |
| 2008/0116397 | A1* | 5/2008 | Yoshida ................. B82Y 10/00 250/492.22 |
| 2010/0055578 | A1* | 3/2010 | Fujimura ............... B82Y 10/00 430/5 |
| 2010/0055587 | A1 | 3/2010 | Fujimura et al. |
| 2010/0225864 | A1 | 9/2010 | Inoue et al. |
| 2012/0286168 | A1* | 11/2012 | Derks .................... B82Y 10/00 250/396 R |
| 2012/0286170 | A1 | 11/2012 | Van De Peut et al. |
| 2012/0286173 | A1* | 11/2012 | Van De Peut ......... B82Y 10/00 250/492.1 |
| 2013/0148091 | A1* | 6/2013 | Sentoku ............... G03F 7/70141 355/67 |
| 2013/0283216 | A1 | 10/2013 | Pearman et al. |
| 2014/0127628 | A1* | 5/2014 | Fujimura ............ H01J 37/3174 430/296 |

FOREIGN PATENT DOCUMENTS

| | | |
|---|---|---|
| WO | WO 2009 127658 A1 | 10/2009 |
| WO | WO 2010 134026 A2 | 11/2010 |
| WO | WO 2012 156510 A1 | 11/2012 |

OTHER PUBLICATIONS

Horiuchi Toshiyuki Gradation Stitching Exposure for Step-and-Scan Projection Printing System Jpn J Appl Phys. vol. 37 1998 pp. 6641-6647.*

Hakkenes et al., "Demonstration of Real Time pattern correction for high thoughput maskless lithography", Proc of SPIE vol. 7970 79701A-1, 2011.

Wieland et al., "Throughput enhancement technique for MAPPER maskless lithography", Proc. of SPIE vol. 7637 76371Z-1 t/m 76371Z-11, 2010.

Yamashita et al., "Recent Progress in Electon-Beam Cell Projection Technology", Jpn. J. Appl. Phys. vol. 35 pp. 6404-6141, Dec. 1996.

* cited by examiner

ENHANCED STITCHING BY OVERLAP DOSE AND FEATURE REDUCTION

BACKGROUND OF THE INVENTION

1. Field of the Invention

The present invention relates to methods and systems for exposing a target using charged particles, and methods and systems for processing exposure data for use in charged particle lithography, and in particular to methods and systems for performing stitching during exposure of a target.

2. Description of the Related Art

In a multi-beam lithography system, multiple beams are used to expose a target, such as a silicon wafer coated with resist. Charged particle beams, such as electron beams, are usually used. The multiple beams are scanned across the surface of the target, each beam simultaneously writing a portion of the pattern onto a portion of the target. To provide the required precision at a satisfactory throughput, a very large number of beams may be used, e.g. tens or hundreds of thousands, or even millions of beams. An example of such a system is described in M. J. Wieland et al, "Throughput enhancement technique for MAPPER maskless lithography", Proc. of SPIE, Vol. 7637, 76371Z (2010).

During a single exposure the lithography system usually exposes an area of the target, e.g. a single 26 mm×33 mm field. Each beam is used to scan a certain allocated sub-area on the target. Where a very large number of beams are used, these sub-areas are very small.

As each beam scans across the surface of the target, it is modulated in some way to reproduce the required pattern to be exposed onto the target. In a maskless lithography system, exposure data is used to modulate the beams. The exposure data usually includes pattern data describing the shapes (called features) to be exposed onto the target. As each beam scans over a certain part of the surface of the target, the pattern data may be streamed to the lithography system and used to adjust the intensity of each beam as it scans the target. For example, the pattern data may be used to switch each beam on and off to expose certain parts of the target where a feature is to be formed on the target and not expose other parts along the scan line followed by the beam.

The exposure data may also include exposure dose values, providing further modulation of the intensity of the beams as they scan. For example, if the pattern data is used to switch a beam on over a certain portion of its scan path, the exposure dose values may instruct the lithography system to set the intensity of the beam at some value between zero and one hundred percent, e.g. at 70%, during that portion of its scan path. In a raster scan lithography system this exposure dose modulation may be accomplished by dithering the beams, e.g. switching the beams on and off with a certain mark-space ratio to achieve the desired beam intensity. Note that the exposure dose values may also be used to set the intensity of a beam which the pattern data indicates should be switched off. An example of the processing of exposure data for use in a maskless lithography machine is described in E. A. Hakkennesa et al., Demonstration of Real Time pattern correction for high throughput maskless lithography", Proc. of SPIE, Vol. 7970, 79701A-1 (2011).

The lithography system which generates the beams inevitably suffers from various errors and uncertainties arising during its manufacture and operation, resulting in errors and uncertainties in the exact position of each beam scanning the target relative to other beams scanning the target. The target is usually mounted on a stage which moves during the exposure, and there are also errors and uncertainties in the stage movement and in the exact position of the target in the lithography system. As a result, a sub-area of the target scanned by one beam may not be perfectly aligned with an adjacent sub-area of the target scanned by another beam.

To avoid exposure errors caused by this mis-alignment such as gaps between sub-areas or imperfect alignment of features exposed in adjacent sub-areas, the lithography system may be designed so that adjacent sub-areas overlap. In the area where adjacent sub-areas overlap, more than one beam may write onto the target in a so-called stitching region. Stitching in this context refers to beam writing onto the target at the interface between adjacent sub-areas. Various stitching techniques are possible for writing in the overlap area.

In one approach, one of the beams is switched off when scanning in the overlap area, so that only one of the beams is used to actually expose the overlap area. If this approach is used without regard to the pattern to be exposed, it will merely remove the overlap and re-introduce the problem of an unexposed gap between sub-areas. A "smart boundary" technique may be used in which the beam to write in the overlap area is selected based on the features to be exposed in the overlap area, to ensure that critical parts of the pattern are exposed by only one beam and any gap occurs in a non-critical part of the pattern. In another approach, both beams are used to expose the overlap area using a reduced exposure dose. One beam may fade out as it scans across the overlap area while a second beam fades in to produce a soft edge. A combination of these two approaches may also be used, in dependence on the topology of the features to be exposed.

Although these techniques can reduce the impact of imperfect alignment between neighboring sub-areas, they require complex calculation in dependence on the topology of the features to be exposed and may still result in a significantly higher variation in critical dimension (CD) in the stitching region than in other regions of the target.

In a different electron beam lithography technique, known as cell (or character) projection electron beam lithography, stitching defects may occur between neighbouring shot areas. US 2004/0191643 A1 and Hiroshi Yamashita et al., "Recent Progress in Electron-Beam Cell Projection technology" Jpn. J. Appl. Phys. Vol. 35 (1996) pp. 6404-6414 approach this problem by using additional patterns to reduce errors between adjacent, non-overlapping shot areas by using overlapping or coupling patterns. This is however a rule-based mechanical approach, realized by adapting the cell projection stencil used for forming the shaped beam.

In cell projection technology it is further common to perform a plurality of passes over the target surface in order to average out precision errors in the system. This however reduces the throughput of such systems. US 2010/0055587 A1 discloses using overlapping shots and variable doses in order to reduce the number of shots necessary for forming a pattern using the cell projection technology.

These disclosures, however, do not offer any solution to reducing the stitching errors in multiple charged beam direct write lithography described above.

US 2005/0211921 A1 and US 2012/0286170 A1, assigned to the present applicant, disclose reducing beam deflection errors in multiple beam lithography by using partially overlapping writing areas.

BRIEF SUMMARY OF THE INVENTION

The invention addresses the above problems by providing a method and system for processing exposure data to provide improved stitching in an overlap area on a target.

The invention makes use of a higher exposure dose in the overlap area to increase exposure latitude to improve critical dimension uniformity (CDu) in the overlap area. Because more than one beam is available to write in the overlap area, a higher exposure dose can be imparted in the overlap area without incurring a throughput penalty. In this way, stitching can be performed to deal with mis-alignment in the lithography system while maintaining a CDu in the overlap areas which is comparable or better than the CDu in the non-overlap areas where there is no stitching.

In one aspect the invention provides a method for processing exposure data for exposing a pattern on a target using a plurality of charged particle beams, the exposure data comprising pattern data representing one or more features to be written on the target, the method comprising dividing the pattern data into a plurality of sub-sections, each of the sub-sections comprising pattern data describing a part of the pattern to be written in a corresponding sub-area of the target, wherein the pattern data comprises overlap pattern data describing a part of the pattern to be written in a corresponding overlap area of the target where adjacent sub-areas overlap, and processing the overlap pattern data to reduce a size of one or more features described by the overlap pattern data. The processing reduces the size of the features described by the overlap pattern data with respect to the size of the features described by non-overlap pattern data, i.e. pattern data not part of the overlap pattern data.

The exposure data further comprises exposure dose values describing exposure dose of the charged particle beams, the method comprising dividing the exposure dose values into a plurality of sub-portions, each of the sub-portions including exposure dose values for exposing a corresponding sub-area of the target, wherein the exposure dose values comprise overlap dose values describing an exposure dose for a corresponding overlap area of the target where adjacent sub-areas overlap, and non-overlap dose values describing an exposure dose for a corresponding non-overlap area of the target where adjacent sub-areas do not overlap, and setting one or more of the exposure dose values such that a sum of exposure dose values corresponding to a position in an overlap area exceeds a maximum exposure dose value for the non-overlap areas.

The exposure data may include both pattern data and exposure dose data. The exposure dose data may be represented separately from the pattern data in the exposure data, e.g. one portion of an exposure data file may comprise pattern data and a separate portion of the data file may comprise exposure dose data. Alternatively the exposure dose data and the pattern data may be represented by combined data which encompasses both types of data. The method for processing exposure data may comprise processing both pattern data and exposure dose data in the methods described herein.

The overlap pattern data, defining a reduction in dimension of the one or more features in the overlap area, may be calculated from the exposure dose data in combination with the desired size of the feature after development of a resist layer present on the target. Thereby, the exposure dose data for the overlap region and the overlap pattern data are matched such that the features in the overlap region resulting after development of the resist comply with the intended feature dimensions defined by pattern data, although the area exposed by charged particle beams to form the feature is reduced.

The target, usually a wafer coated with resist, is exposed by a plurality of charged particle beams, where each beam writes in a separate sub-area of the target. In this way, the surface of the target which is to be exposed is divided into sub-areas. The sub-sections of the pattern data each comprise data to be used for exposing a corresponding sub-area of the target. Where adjacent sub-areas of the target overlap they create an overlap area on the target. The portion of pattern data which is to be used for exposing an overlap area is referred to as overlap pattern data. Similarly, the sub-portions of the exposure dose data each comprise data to be used for exposing a corresponding sub-area of the target. The portion of exposure dose data which is to be used for exposing an overlap area is referred to as overlap dose data.

In one embodiment, a sub-section of the pattern data is used for control of a single charged particle beam to expose a particular sub-area of the target. The overlap pattern data may form part of more than one sub-section of the pattern data, and be used to control more than one charged particle beam for exposure of the overlap area on the target by more than one beam. Similarly, a sub-portion of the exposure dose data may be used for control of a single charged particle beam to expose a particular sub-area of the target. The overlap dose data may form part of more than one sub-portion of the exposure dose data, and be used to control more than one charged particle beam for exposure of the overlap area on the target by more than one beam.

The features to be exposed on the target, which are described by the pattern data, may lie partly or wholly within the overlap pattern data, representing features that are to be formed partly or wholly in an overlap area on the target. Before exposing the target, the pattern data describing these features or portions of features which are to be formed in an overlap area are processed to reduce the size of the features or portions of to be formed in the overlap area with respect to features or portions of features to be formed in non-overlap areas on the target. For example, this processing may result in altering the overlap pattern data so that the data describes the feature with a reduced width in the overlap area but with no reduction in width in non-overlap areas.

A first one of the sub-sections of pattern data may correspond to a first one of the sub-areas, and a second one of the sub-sections of pattern data may correspond to a second one of the sub-areas, and each of the first and second sub-sections may include overlap pattern data corresponding to an overlap area of the first and second sub-area. The pattern data may be arranged so that overlap pattern data forms part of each of the sub-sections of pattern data corresponding to the overlapping sub-areas of the target. For example, where two sub-areas of the target overlap to form an overlap area, the two sub-sections with pattern data for exposing the two sub-areas may each include the overlap pattern data for exposing the overlap area.

The sub-sections of pattern data may include both overlap pattern data and non-overlap pattern data, where the overlap pattern data contains pattern data describing a portion of the pattern to be written in a corresponding overlap area on the target (in which one or more sub-areas of the target overlap), and the non-overlap pattern data contains pattern data describing a portion of the pattern to be written in a corresponding non-overlap area on the target (which is part of a sub-area which does not overlap with any other sub-area of the target).

The pattern data may include a feature in the form of a rectangular portion of a shape, the shape being comprised partly in the overlap pattern data and partly in non-overlap pattern data, and processing of the overlap pattern data may result in reducing a width of the rectangular portion in the overlap pattern data with respect to the width of the rectangular portion in the non-overlap pattern data. For example, a rectangular portion of a shape, such as a line, may be described by the pattern data, and may lie partly within overlap pattern data and partly within non-overlap pattern data, representing a shape that is to be formed partly in an overlap area on the target and partly in a non-overlap area on the target. The pattern data describing the shape is processed to reduce the width of the part of the rectangular portion to be formed in the overlap area. For example, this processing may result in altering the overlap pattern data so that the pattern data describes the rectangular portion with a smaller width in the overlap area and a larger width in the non-overlap area.

The reduction in size of a feature represented by the overlap pattern data may result in a dimension of the reduced feature being smaller in the overlap pattern data than in non-overlap pattern data. The reduction in size of a feature may be a reduction in a width of the feature in a direction perpendicular to the direction of intersection between the adjacent sub-areas forming the overlap area, or the reduction in size may be a reduction of any dimension of the feature.

The setting of the dose values of the exposure dose data may comprise generating two sets of dose values for each overlap area of the target, each dose value in one set having a corresponding dose value in the other set, wherein the sum of the corresponding dose values in the two sets for at least some of the dose values exceeds a maximum dose value for the non-overlap areas of the target where adjacent sub-areas do not overlap.

The exposure dose data for an overlap area of the target may be used for control of exposure dose of more than one charged particle beam. If two beams are used to expose the overlap area, the exposure dose data may be used to generate two different sets of exposure dose values, where one set of dose values is used to control one beam and the other set of dose values is used to control another beam. The two sets of dose values can be modified so that the dose control is different for the two beams. Both beams are writing in the same overlap area, so that the actual dose imparted to the target in the overlap area is the sum of the dose from the two beams. The two sets of dose values may be modified so that the sum of corresponding dose values in the two sets is greater than dose values for a non-overlap area. In this way, the dose in an overlap area is higher than the dose in non-overlap areas, for at least some portion of the overlap area.

The exposure dose data may be divided into a plurality of sub-portions, each of the sub-portions including exposure dose values for exposing a corresponding sub-area of the target, wherein the exposure dose data comprise overlap dose values describing exposure dose for a corresponding overlap area of the target where adjacent sub-areas overlap, and non-overlap dose values describing an exposure dose for a corresponding non-overlap area of the target where adjacent sub-areas do not overlap. A first sub-portion of exposure dose data may correspond to a first one of the sub-areas, and a second sub-portion of exposure dose data may correspond to a second one of the sub-areas, and each of the first and second sub-portions may include overlap dose values corresponding to an overlap area of the first and second sub-area.

The methods may further comprise identifying a first sub-portion of the exposure dose data corresponding to a first one of the sub-areas of the target; identifying a second sub-portion of the exposure dose data corresponding to a second one of the sub-areas of the target; generating first overlap dose data having a plurality of dose values each corresponding to a writing position in an overlap area of the target in which the first and second sub-areas overlap, wherein at least a portion of the dose values vary in dependence upon their corresponding writing position within the overlap area, the dose values decreasing in magnitude with increasing distance of their corresponding writing position from the part of the first sub-area outside of the overlap area; and generating second overlap dose data having a plurality of dose values each corresponding to a writing position in the overlap area of the target, wherein at least a portion of the dose values vary in dependence upon their corresponding writing position within the overlap area, the dose values decreasing in magnitude with increasing distance of their corresponding writing position from the part of the second sub-area outside of the overlap area.

In this way the exposure dose may decrease (fade out) as a beam scans across the overlap area towards the edge of a sub-area, and the exposure dose of a second beam may increase (fade in) as it scans across the overlap area starting from the edge of a sub-area. The variation in the dose values of the first and second overlap dose data may be a linear variation or a sinusoidal variation or some other variation in dependence on corresponding writing position of the dose values. Not all of the dose values need to be reduced in the overlap area, e.g. a portion of the dose values in the overlap area near to a non-overlap area may retain their previous values.

The reduction of at least some of the dose values of the first overlap dose data may be linear with respect to distance from the first sub-area of the target, and the reduction of at least some of the dose values of the second overlap dose data may be linear with respect to distance from the second sub-area of the target. In another arrangement, the reduction of at least some of the dose values of the first overlap dose data may be sinusoidal with respect to distance from the first sub-area of the target, and the reduction of at least some of the dose values of the second overlap dose data may be sinusoidal with respect to distance from the second sub-area of the target.

The dose values of the exposure dose data comprise dithering values. These dithering values may be used to switch individual beams on and off to achieve variation of the exposure dose of the beams.

The reduction in size of the features described by the overlap pattern data may be related to the amount by which a sum of exposure dose values corresponding to a position in an overlap area of the target exceeds a maximum exposure dose value for the non-overlap areas of the target. This reduction in size of the features may be a function of the amount by which a sum of exposure dose values corresponding to a position in an overlap area of the target exceeds a maximum exposure dose value for the non-overlap areas of the target, and may be proportional to the amount by which a sum of exposure dose values corresponding to a position in an overlap area of the target exceeds a maximum exposure dose value for the non-overlap areas of the target. The higher exposure dose in the overlap area is compensated by the reduction in size of the features in an overlap area. These two adjustments to the exposure data are preferably implemented such that the resolved pattern in the overlap areas after development of the resist exhibits the desired dimensions of features in the overlap areas. The dimensions of the features written in the resist in the overlap area may be calculated based on the overlap dose data and the desired resulting dimensions of the features after development of the resist.

In a further aspect the invention comprises an exposure data file for exposing a pattern on a target using a plurality of charged particle beams, the exposure data comprising pattern data representing one or more features to be written on the target and exposure dose data describing exposure dose of the charged particle beams for exposing the pattern on the target, wherein the exposure data has been processed according to any of the methods described herein. In another aspect the invention comprises a data carrier containing the exposure data file.

In a further aspect the invention comprises a data processing system comprising memory means for storing exposure data and processing means for processing the exposure data according to the method of any one of the claims.

The data processing system may further comprise memory means for storing the processed exposure data.

In yet another aspect, the invention comprises a method for exposing a target using plurality of charged particle beams according to exposure data, the exposure data comprising pattern data representing one or more features to be written on the target and exposure dose data representing an exposure dose of the charged particle beams, the method comprising processing the exposure data according to any of the methods described herein, and exposing the target using the charged particle beams controlled in accordance with the processed exposure data. The method may comprise assigning a first one of the charged particle beams for exposing a first sub-area of the target; assigning a second one of the charged particle beams for exposing a second sub-area of the target; wherein the first and second sub-areas are adjacent and overlap in an overlap area; processing the exposure data according to the method of any of the methods described herein; exposing the first sub-area of the target using the first charged particle beam in accordance with a first portion of the processed exposure data; and exposing the second sub-area of the target using the second charged particle beam in accordance with a second portion of the processed exposure data.

In yet another aspect, the invention comprises a method for exposing a pattern on a target using a plurality of charged particle beams, the method comprising exposing a first sub-area of the target using a first one of the charged particle beams, including an overlap area in which the first sub-area overlaps with a second sub-area of the target; and exposing a second sub-area of the target a second one of the charged particle beams, including the overlap area; wherein an exposure dose in at least a portion of the overlap area is higher than a maximum exposure dose in the first and second sub-areas outside of the overlap area.

The method comprises applying a combined exposure dose of the first and second charged particle beams when writing in at least a portion of the overlap area higher than a maximum exposure dose of the first charged particle beam when writing in the first sub-area outside of the overlap area and higher than a maximum exposure dose of the second charged particle beam when writing in the second sub-area outside of the overlap area. For at least a portion of the overlap area, the exposure dose of the first charged particle beam may vary in dependence upon its writing position within the overlap area, wherein the exposure dose of the first charged particle beam is reduced with increasing distance from the part of the first sub-area outside of the overlap area. Also, the exposure dose of the second charged particle beam may vary in dependence upon its writing position within the overlap area, wherein the exposure dose of the second charged particle beam is reduced with increasing distance from the part of the second sub-area outside of the overlap area. The variation in the exposure dose of the first and second charged particle beams may be a linear variation or a sinusoidal variation in dependence writing position.

The charged particle beams may be controlled according to pattern data describing one or more features to be written on the target, the method comprising processing the overlap pattern data to reduce a size of one or more features to be written in the overlap area with respect to features to be written in the first and second sub-areas outside of the overlap area. The reduction in size of features described by the overlap pattern data may be a function of, and may be proportional to, the amount by which an exposure dose in the overlap area is higher than a maximum exposure dose in the first and second sub-areas outside of the overlap area.

Yet another aspect of the invention comprises a charged particle lithography system for exposing a target using a plurality of charged particle beams, the system comprising a charged particle generator adapted for generating the charged particle beams; a modulation system adapted to modulate the charged particle beams in accordance with exposure data; a deflection system adapted to deflect the charged particle beams for scanning the beams over the surface of the target; a projection lens system adapted to project the charged particle beams onto the target; a moveable stage for holding the target; and one or more control units adapted to control the modulation system, the deflection system, and the stage; wherein the lithography system is adapted for exposing the target in accordance with the method of exposing the target described herein.

The modulation system may comprise a beamlet blanker array and beam stop array for switching on and off individual beams of the plurality of charged particle beams. The modulation system may be adapted to adjust an exposure dose of the charged particle beams in accordance with exposure dose data. This adjustment of exposure dose may be achieved by dithering the charged particle beams. The modulation system may be adapted to switch the charged particle beams on or off in accordance with pattern data.

BRIEF DESCRIPTION OF THE DRAWINGS

Various aspects of the invention will be further explained with reference to embodiments shown in the drawings wherein.

DESCRIPTION OF ILLUSTRATIVE EMBODIMENTS

The following is a description of various embodiments of the invention, given by way of example only and with reference to the drawings. Unless noted otherwise, the drawings are not drawn to scale.

Figure 1:
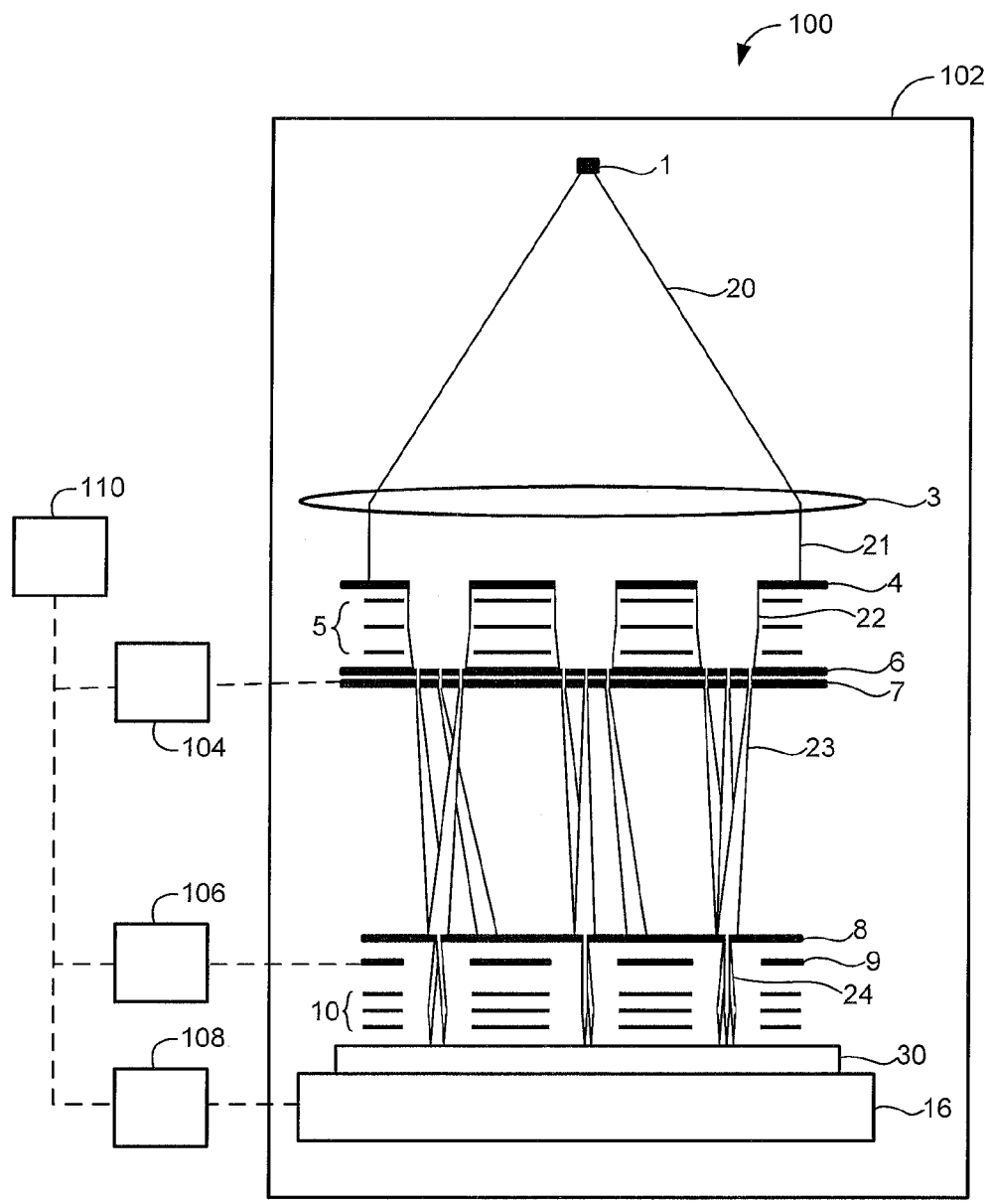
FIG. 1 is a simplified schematic overview of an example of a charged particle multi beamlet lithography system.

FIG. 1 shows a simplified schematic drawing of an embodiment of a charged particle multi-beamlet lithography system. The embodiment shown is based upon an electron beam optical system having no common cross-over of all the electron beams, such as described for example in U.S. Pat. Nos. 6,897,458; 6,958,804; 7,019,908; 7,084,414; 7,129,502; 7,709,815; and 7,842,936, which are all assigned to the owner of the present invention and are all hereby incorporated by reference in their entirety. The embodiment shown forms a plurality of beamlets from a plurality of sub-beams.

An electron source 1 produces a homogeneous expanding electron beam 20 which passes a collimator system 3 to produce a collimated electron beam 21 and then impinges on sub-beam aperture array 4. The aperture array 4 blocks part of the beam and emits a plurality of sub-beams 22. The system may generate a large number of sub-beams 22, e.g. from 10,000 to 100,000 sub-beams.

The sub-beams pass through a condenser lens array 5, which focuses the sub-beams approximately in the plane of beam stop array 8 and towards a corresponding opening in beam stop array 8. The sub-beams 22 are intercepted by multiple aperture array 6 which includes a plurality of apertures in the path of (i.e., corresponding to) each sub-beam, producing a group of beamlets 23 from each sub-beam 22. Each group of beamlets is directed towards a corresponding opening in beam stop array 8.

The beamlets 23 then pass through beamlet blanker array 7. The beamlet blanker array 7 may deflect individual beamlets 23 in a group of beamlets at certain times in order to blank them. Deflected (blanked) beamlets are blocked by beam stop array 8, while undeflected (unblanked) beamlets pass through a corresponding opening in beam stop array 8 and are subsequently deflected in beam deflector array 9 and projected onto the target by projection lens arrangement 10. The beam deflector array 9 provides for deflection of each beamlet 23 in a direction substantially perpendicular to the direction of the undeflected beamlets 23 to scan the beamlets across the surface of the target. For lithography applications, the target usually comprises a wafer provided with a charged-particle sensitive layer or resist layer.

In the example shown in FIG. 1, the aperture array 6 produces a group of three beamlets 23 from each sub-beam 22. In a practical embodiment, a much larger number, e.g. 50 beamlets or more may be directed through a single projection lens system.

Figure 2:
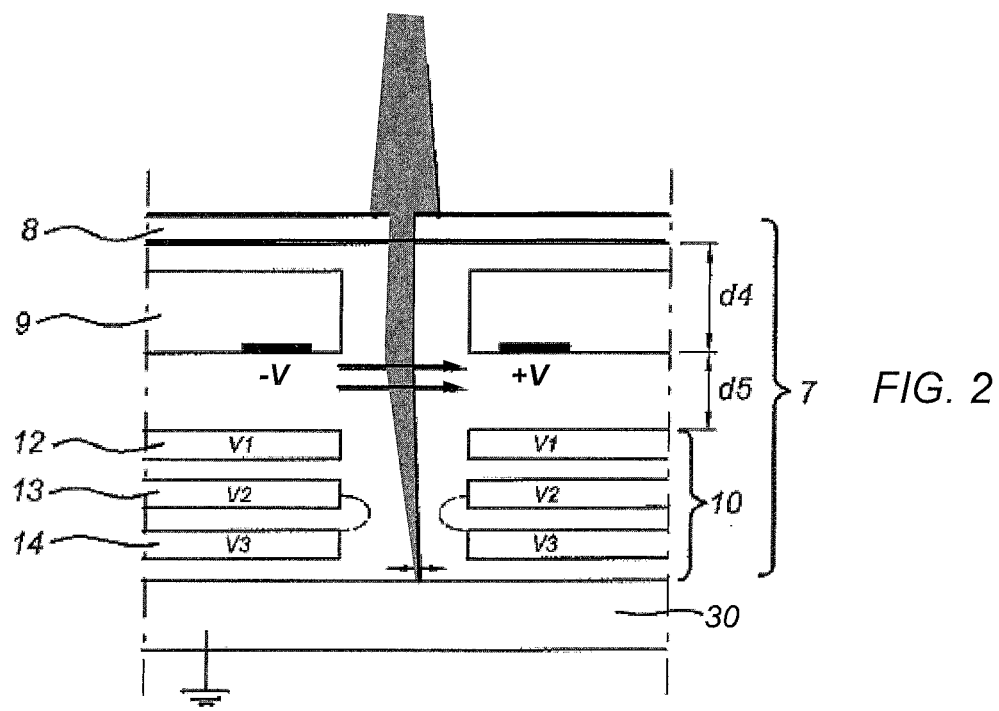
FIG. 2 is a simplified schematic overview, in side view, of an end module of the lithography system of FIG. 1.

FIG. 2 shows an embodiment of an end module in more detail, showing the beam stop array 8, the deflection array 9, and the projection lens arrangement 10, projecting an electron beamlet onto a target 30. The beamlets 23 are projected onto target 30, preferably resulting in a geometric spot size of about 10 to 30 nanometers in diameter. The projection lens arrangement 10 has three plates 12, 13 and 14 arranged in sequence, used to form an array of electrostatic lenses.

FIG. 2 illustrates deflection of a beamlet 23 by deflection array 9 in the Y-direction, illustrated in FIG. 2 as a deflection of the beamlet from left to right. In the embodiment of FIG. 2, an aperture in deflection array 9 is shown for one or more beamlets to pass through, and electrodes are provided on opposite sides of the aperture, the electrodes provided with a voltage +V and −V. The potential difference over the electrodes causes deflection of the beamlets passing through the aperture. Dynamically changing the voltages (or the sign of the voltages) sweeps the beamlets over the surface of the target in a scanning fashion.

Referring back to FIG. 1, control unit 104 receives beamlet modulation data and supplies the data to the blanker array 7 for control of the blanking of individual beamlets, control unit 106 receives timing data and sends signals to the deflection array 9 to control the scan deflection of the beamlets, and control unit 108 receives control data and sends signals to the moveable stage 16 to control movement of the target 30 supported on the stage. This movement is referred to as the Y-direction or the mechanical scan direction. The movement in the Y-direction is usually achieved by mechanical movement of the stage 16, but could alternatively be achieved by movement of the rest of the system, deflection of the beamlets, or any combination of the above techniques. The beamlets are scanned across the surface of the target 30 by deflector array 9 in the X-direction or deflection scan direction, usually substantially perpendicular to the Y-direction, i.e. nearly perpendicular but not exactly perpendicular, as explained below.

The blanking of beamlets by the blanker array 7, the scan deflection of the beamlets by deflector array 9, and movement of the target 30 by stage 16 should be coordinated to permit correct exposure of the pattern on the target. A control unit 110 may be used to coordinate these operations.

As the beamlets 24 are scanned across the surface of the target 30, the beams are modulated to reproduce the required pattern to be exposed onto the target. In a maskless lithography system, exposure data is used to modulate the beams. The exposure data usually includes pattern data describing the shapes (called features) to be exposed onto the target. As each beamlet 24 scans over a certain part of the surface of the target, the pattern data may be streamed to the lithography system and used to adjust the intensity of each beamlet as it scans the target. In the system of FIG. 1, the pattern data is streamed to the blanker array 7 to switch each beamlet on and off to expose certain parts of the target and not expose other parts along the scan line followed by the beamlet. For example, the pattern data may instruct a beamlet to be switched on over a part of its scan path where a feature is to be formed on the target, and instruct the beamlet to be switched off over other parts of its scan path where a feature is not to be present.

The exposure data may also include exposure dose values, used to further modulate the intensity of the beamlets as they scan, i.e. in addition to the beam modulation in accordance with the pattern data. For example, if the pattern data is used to switch a beamlet on over a certain portion of its scan path, the exposure dose values may instruct the lithography system to set the intensity of the beam at some value between zero and one hundred percent, e.g. at 70%, during that position of its scan path. Note that the exposure dose values may also be used to set the intensity of a beam which the pattern data indicates should be switched off.

Figure 3:
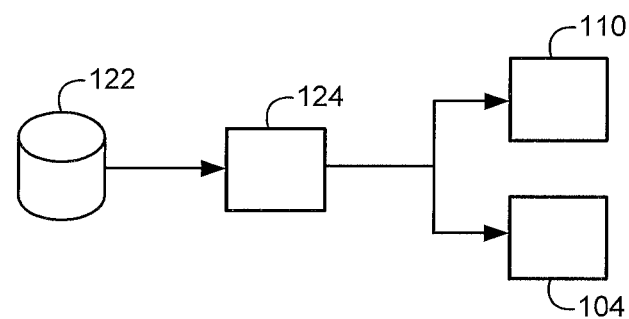
FIG. 3 is a simplified block diagram of an exposure data processing system.

The pattern data is usually initially generated in a vector format, such as a GDS-II or OASIS format. The exposure dose information may be stored e.g. as a dose map or by using dose tags associated with each feature in the pattern data. FIG. 3 illustrates a block diagram of a basic system for supplying the exposure data to the lithography system, including a data storage unit 122 for storing the exposure data, and processing unit 124 for processing the exposure data to prepare it for streaming to the lithography system, e.g. to control unit 104 and control unit 110. The data storage unit 122 may comprise one or more hard disk storage devices or other type of storage medium or device suitable for storing large volumes of data, and the processing unit 124 may comprise one or more computer processors with suitable software for processing the exposure data.

The exposure data typically undergoes processing to correct for certain factors which may affect the uniformity of features written onto the resist on the target, referred to as critical dimension uniformity (CDu). Corrections are usually applied to the pattern data to compensate for processes which create such non-uniformity. Typical effects that can be corrected are etch loading effect, charged particle beam proximity effect, and resist heating effect. These effects can be corrected for by changing the shape of the pattern (CD biasing), or by changing the local dose of the pattern (dose correction), or a combination of dose and shape correction. The exposure data is then split into sections allocated to particular sub-beams or beamlets. The vector-based data is then usually converted into a bitmap format for modulating the beamlets.

Figure 4:
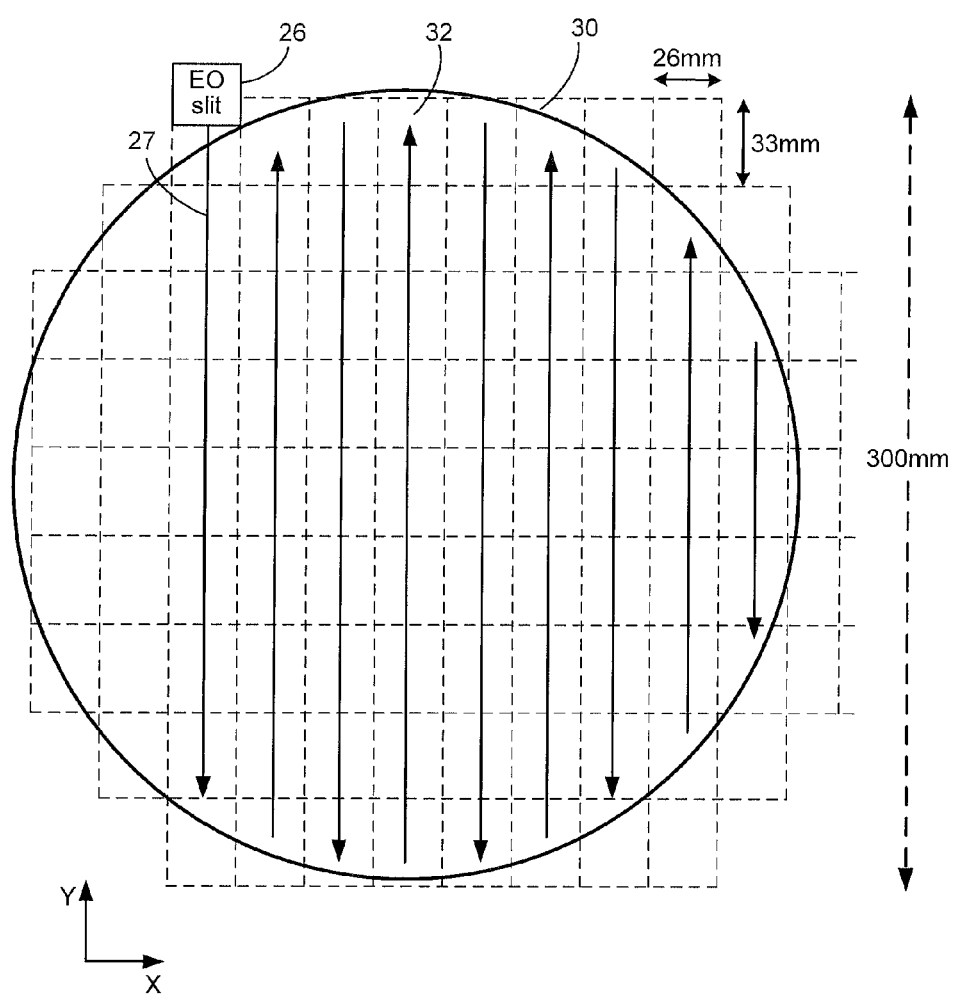
FIG. 4 is a diagram of an example of a wafer divided into fields.

As mentioned previously, for lithography applications, the target usually comprises a wafer provided with a charged-particle sensitive resist layer. The current industry standard is a 300 mm wafer, although new systems accommodating 450 mm wafers are being designed. Wafers are typically divided into fixed size fields with a maximum dimension of 26 mm×33 mm, although other sized fields may also be used. Each field may be processed to produce multiple integrated circuits (i.e. the layout for multiple chips may be written into a single field) but the ICs usually do not cross a field border. FIG. 4 (not drawn to scale) shows a wafer 30 divided into fields 32, with the direction 27 of writing the fields.

In one embodiment of the lithography machine, the machine generates 13,260 sub-beams and each sub-beam is split into 49 beamlets arranged in a 7×7 array, resulting in 649,740 beamlets. When this arrangement is applied in the machine of FIG. 1, the aperture array 4 contains 13,260 holes and the aperture array 6 and beamlet blanker array 7 contain 649,740 holes, which form the electron-optical (EO) slit 26 in an area of 26×26 mm (i.e. the size of the complete array of beamlets as projected onto the wafer). Each sub-beam comprising 49 beamlets may be used to write a single stripe in each field in the Y-direction.

Figure 5:
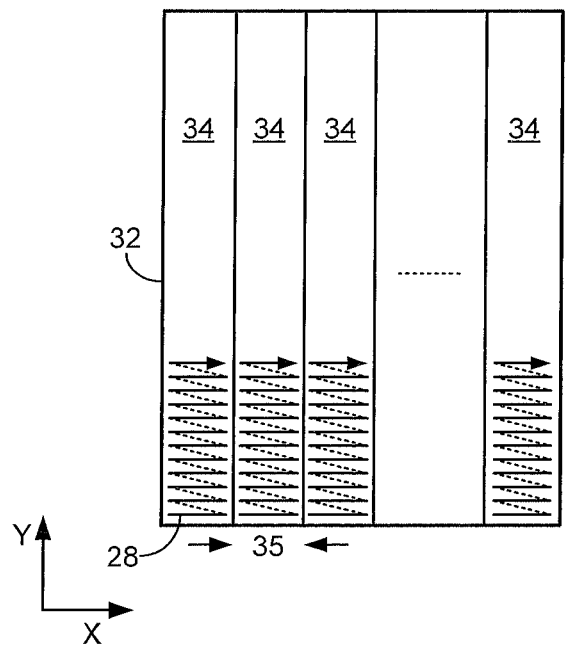
FIG. 5 is a diagram of an arrangement of charged particle sub-beam writing paths for writing a field of a wafer.

FIG. 5 illustrates an example of an arrangement of beams for writing a field 32 of a wafer 30. In this arrangement, a single beam (e.g. sub-beam 22 formed by aperture array 4 of FIG. 1) is used for writing one sub-area 34 (referred to herein as a stripe) of a field 32. In this embodiment, each sub-beam is scanned in an X-direction across the width of a stripe while the wafer 30 is moved in the Y-direction, resulting in each stripe 34 being exposed along a writing path 28 along the length of the field 32. In this example, the sub-beams are arranged with writing paths 28 evenly distributed over the width of the field (e.g. over 26 mm) in the X-direction resulting in stripes of width 35 (e.g. 2 μm) in the X-direction (substantially perpendicular to the Y-direction) and a stripe length as long as the field in the Y-direction (e.g. 33 mm in the example of FIG. 4).

The wafer is preferably written on (exposed) by the lithography machine in both a backward and forward Y-direction, as shown in FIG. 4. For convenience the drawings show the X- and Y-directions as being perpendicular. However, in some embodiments the two directions are substantially (but not exactly) perpendicular, e.g. the X-direction may be slightly tilted so that movement (scanning) of the sub-beams for writing in the X-direction is coordinated with the simultaneous movement of the target in the Y-direction, resulting in the end of an exposure scan line for a sub-beam being at approximately the same Y-direction position on the wafer as the beginning of the scan line for that sub-beam.

Figure 6:
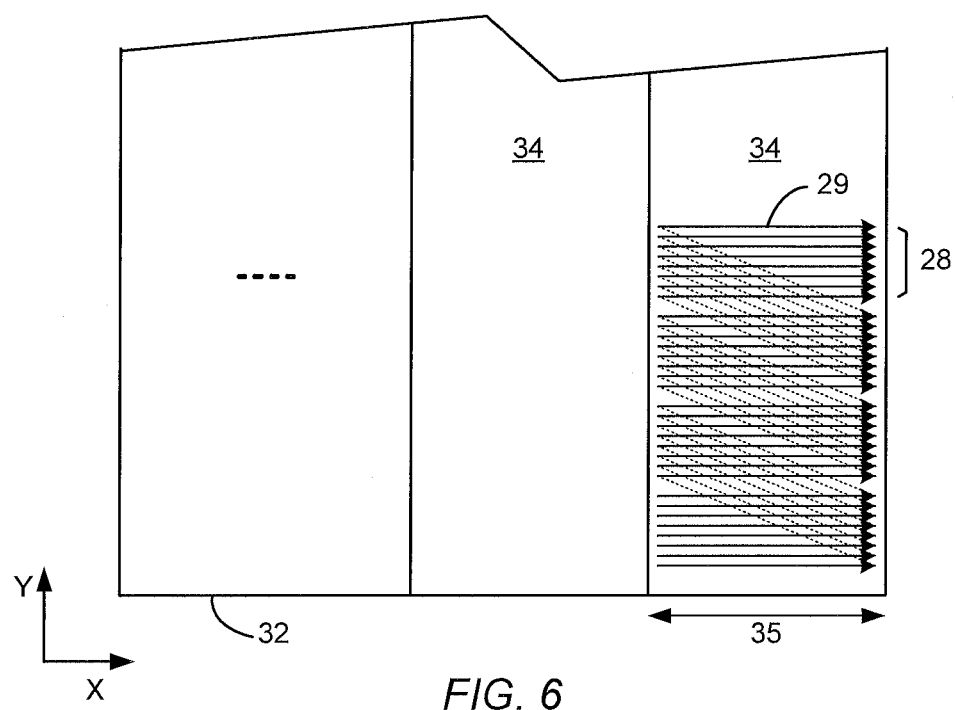
FIG. 6 is a diagram of an arrangement of beamlet writing paths for writing stripes of a field of a wafer.

FIG. 6 illustrates an embodiment in which multiple groups of beamlets are generated, each group of beamlets assigned to writing one stripe 34 of the field 32 of wafer 30. In this arrangement, each group of beamlets (e.g. beamlets 24 formed from a single sub-beam 22 by aperture array 6 of FIG. 1) is used for writing one sub-area 34 (stripe) of a field 32. The sub-beams are arranged with writing paths 28 evenly spaced and distributed in one direction (e.g. in the X-direction across the width of the field 32 as shown in FIG. 5), and multiple beamlets formed from each one of the sub-beams are arranged with writing paths 29 evenly spaced and distributed in a different direction (e.g. in the Y-direction along the length of the field 32). The two directions are preferably exactly or nearly perpendicular to each other.

In the following description the term "beam" is used which may refer to a sub-beam, a group of beamlets (e.g. beamlets 24 formed from a single sub-beam 22 as in FIG. 1), or a single beamlet 24.

As each beam scans across the surface of the target, it is modulated according to exposure data to reproduce the required pattern to be exposed onto the target. The lithography system which generates the beams inevitably suffers from various errors and uncertainties arising during its manufacture and operation, resulting in errors and uncertainties in the exact position of each beam scanning the target relative to other beams scanning the target. The target is usually mounted on a stage which moves during the exposure, and there are also errors and uncertainties in the stage movement and in the exact position of the target in the lithography system. As a result, a sub-area of the target scanned by one beam may not be perfectly aligned with an adjacent sub-area of the target scanned by another beam.

To reduce the negative effects of this mis-alignment of sub-areas on the target, the lithography system may be designed so that adjacent sub-areas overlap. An example is illustrated in FIG. 6 which shows three sub-areas 34a, 34b, 34c which are slightly misaligned in both X and Y directions. Adjacent ones of the sub-areas overlap. Adjacent sub-areas 34a and 34b overlap each other to form overlap area 36ab, and sub-areas 34b and 34c overlap to form overlap area 36bc. The sub-areas 34a, 34b, 34c also include non-overlap areas 38a, 38b, 38c where a sub-area does not overlap with any other sub-area. Note that a sub-area may be entirely overlapping with other sub-areas so that it has no non-overlap area, a sub-area may overlap with one, two, or more other sub-areas, and the sub-areas may overlap in both X and Y directions.

Figure 7:
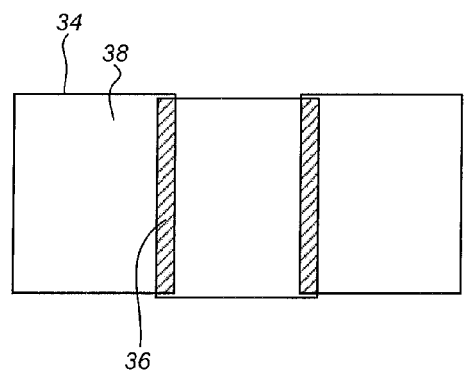
FIG. 7 is an arrangement of sub-areas on a surface of a target.

FIG. 7 shows an arrangement for scanning charged particle beams 24a, 24b, 24c in the sub-areas 34a, 34b, 34c. In this arrangement, a first beam 24a is arranged to scan a first sub-area 34a of the target along writing path 28a, and a second beam 24b is arranged to scan a second sub-area 34b which is adjacent to and overlaps with the first sub-area, along writing path 28b. Note that the sub-areas 34a, 34b are adjacent to each other but the beams 24a, 24b are not necessarily adjacent to each other in the lithography system. The first beam 24a will be modulated with pattern data which describes the features to be exposed in the first sub-area 34a, and the second beam 24b will be modulated with pattern data which describes the features to be exposed in the second sub-area 34b.

Figure 8:
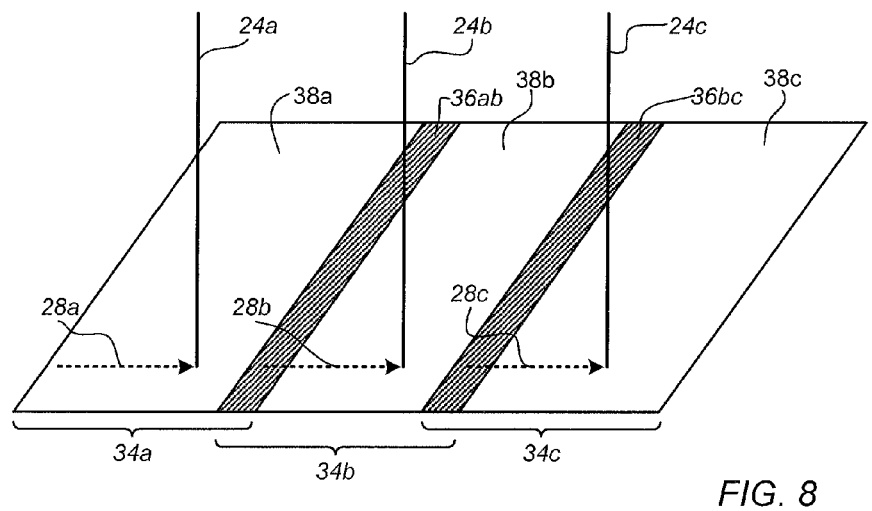
FIG. 8 is a diagram showing beams exposing sub-areas on a surface of a target.

The first and second beams 24a, 24b will both scan the overlap area 36ab where the two adjacent sub-areas 34a, 34b overlap each other. FIG. 8 illustrates the overlap area 36ab with beam 24a scanning the target along writing path 28a and beam 24b scanning along writing path 28b. The writing path of the two beams overlap in the overlap area 36ab. This overlap of the writing paths is referred to as "stitching" and reduces the risk that there will be an unexposed gap between adjacent sub-areas and permits smoothing the transition between sub-areas.

If both beams are used without adjustment, the overlap area will be exposed with twice the exposure dose to that used in non-overlapping areas of the target exposed by only one beam. This higher exposure dose will result in the features written in the overlap area being larger than intended. For example, a feature in the folio of a line of uniform width, crossing from a non-overlap area into an overlap area, will be exposed with a greater width in the overlap area than in the non-overlap area. Various approaches are possible for writing in the overlap area to address this issue.

In one approach, one of the beams is switched off when scanning in the overlap area, so that only one of the beams is used to actually expose the overlap area. If this approach is used without regard to the pattern to be exposed, it will merely remove the overlap and re-introduce the problem of an unexposed gap between sub-areas. A "smart boundary" technique may be used in which the beam to write in the overlap area is selected based on the features to be exposed in the overlap area. For example, where a feature to be exposed crosses the boundary between the first non-overlap area 38a and the overlap area 36ab but does not cross the boundary between the overlap area 36ab and the second non-overlap area 38b, then the first beam 24a is used to expose the overlap area where the feature is to be exposed. This enables the feature crossing the boundary to be exposed by one beam in both the non-overlap area 38a and the overlap area 36ab, to result in a more uniform exposure of the feature.

Figure 9:
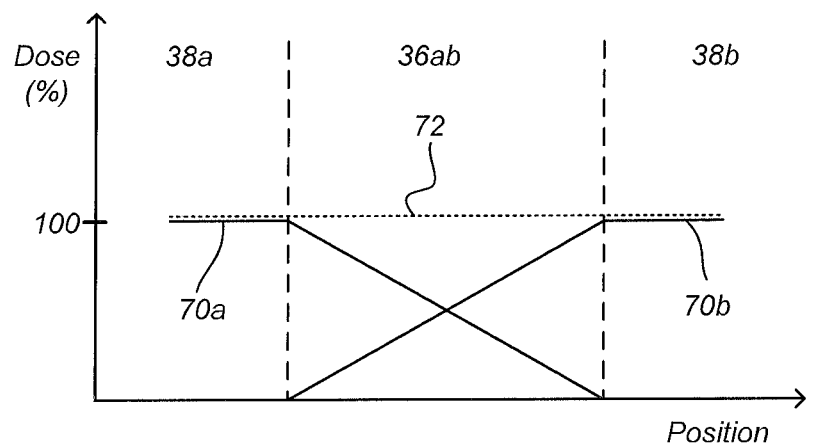
FIG. 9 is a diagram of an example of exposure dose in a stitching region.

In another approach illustrated in FIG. 9, both beams are used to expose the overlap area, but the exposure dose of each beam is tapered off as it writes in the overlap area in a "soft edges" technique. For example, the exposure dose 70a of a first beam 24a may be gradually reduced as it scans across the overlap area 36ab towards the edge of the first sub-area 34a, and the exposure dose 70b of a second beam 24b may be correspondingly increased as it scans across the overlap area 36ab away from the edge of the second sub-area 34b. This could be achieved by reducing the exposure dose 70a of the first beam 24a from a relative 100% dose at the boundary with the first non-overlap area 38a to a 0% dose at the edge of the first sub-area 34a (the boundary with the second non-overlap area 38b), and the exposure dose 70b of the second beam 24b may be increased from a 0% dose at the edge of the second sub-area 34b (the boundary with the first non-overlap area 38a) to a relative 100% dose at the boundary with the second non-overlap area 38b. The combined dose 72 resulting from both beams 24a, 24b scanning is 100% in the overlap area 36ab.

A combination of these two approaches may also be used, in dependence on the topology of the features to be exposed. An example of these techniques is described in U.S. patent application publication 2012-0286170 of the present applicant, which is hereby incorporated by reference in its entirety.

All of the above approaches avoid introducing non-uniformity in the exposure dose as a result of the stitching, i.e. the stitching does not cause a variation in dose across the non-overlap areas and overlap areas of the target. Note that the exposure dose may be varied for different reasons, such as to correct for proximity effect, as discussed below. The above approaches also limit the exposure dose to the nominal 100% dose of the system. For raster scan lithography systems in which the charged particle beams scan the surface of the target in a raster, this 100% dose corresponds to the beams being fully switched on.

In contrast, the invention relies on the use of over-exposure in the overlap area, so that the exposure dose is non-uniform as a result of the stitching. The cumulative exposure dose used in the overlap area resulting from writing by more than one beam is greater than the nominal 100% exposure dose, e.g. the exposure dose from each single beam writing in a non-overlap area of the target. For example, the exposure dose of the first and second beams 24a, 24b when scanning the overlap area 36ab are set so that, over at least a portion of the overlap area, the combined dose from both beams exceeds the dose of each individual beam 24a, 24b when scanning the respective non-overlap areas 38a, 38b.

Figure 10:
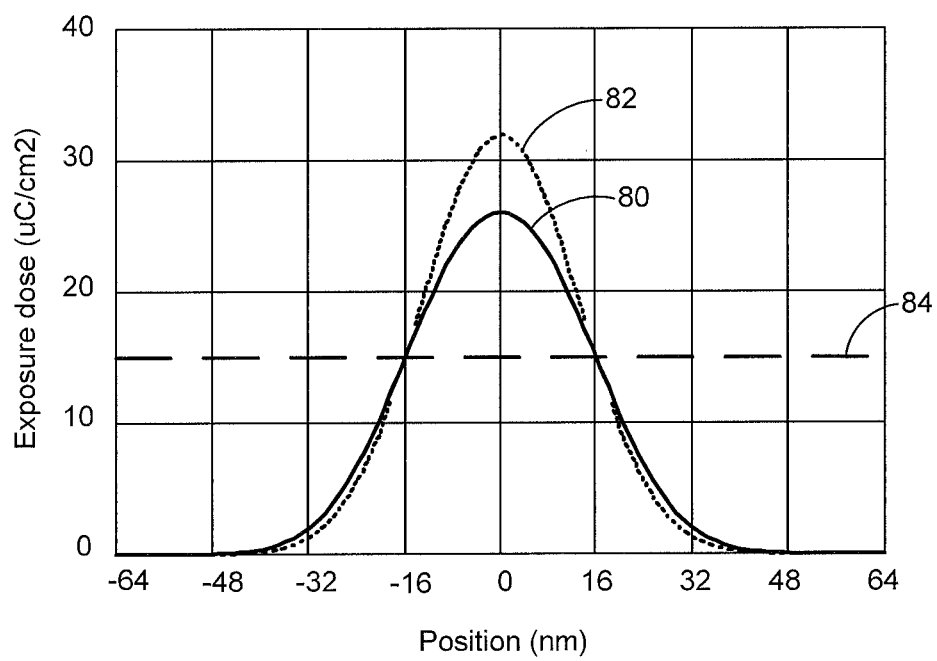
FIG. 10 is a plot illustrating exposure latitude.

This higher dose in the stitching region (the overlap area) improves exposure latitude in the stitching region. Exposure latitude refers to the relationship between the change in dose versus change in critical dimension. FIG. 10 shows a first exposure by a charged particle beam on a resist covered target of a line of width 32 nm. The first exposure is made at a dose of 30 uC/cm2 using a Gaussian electron beam with a spot size of 25 nm FW50, i.e. 50% of the beam current is within a diameter 25 nm, resulting in dose profile 80. The beam is switched on over 32 nm of its scan path to expose the 32 nm line. The resist has a dose to clear 84 of 15 $\mu C/cm^2$ (micro Coulomb per square cm), i.e. at 15 $\mu C/cm^2$ the resist undergoes a transition from not-exposed to exposed. The dose profile 80 thus resolves a line of width 32 nm on the resist surface. Note that the maximum of dose profile 80 is lower than 30 µC/cm2 because the spotsize is in the order of the width of the line that is written. If the line was wider, then the dose profile would reach the 30 µC/cm2 level.

A second exposure of a line of width 24 nm at a dose of 43 µC/cm2 using a Gaussian electron beam with a spot size of 25 nm FW50 results in dose profile 82. The beam is switched on over 24 nm of its scan path to expose the line. As indicated, the dose profile 82 also resolves a line of width 32 nm, i.e. the width at which dose profile 82 reaches the dose to clear 84.

The exposure latitude, describing how much wider the line becomes if the dose is increased, may be calculated by the equation: exposure latitude equals (Δdose/ΔCD)/dose, i.e., $$EL = \frac{\Delta D}{\Delta CD} \cdot \frac{1}{D}$$

where CD refers to critical dimension, the width of the line in this example, ΔD refers to the change in dose, and D refers to the nominal dose. For both dose profiles 80, 82 the dose at the line edge is the same (i.e. 15 μC/cm2). However, the slope (ΔCD/Δdose) of dose profile 82 is much steeper, so that the exposure latitude is higher and a greater dose error can be accepted for a given error in CD.

At a higher dose the dose profile is steeper, resulting in a sharper cut-off of the shape formed in the resist and a more precise formation of the feature, producing better critical dimension uniformity (CDu). A higher exposure dose is thus preferred (up to a certain point).

In a raster scan lithography system, the charged particle beams are scanned over the target to expose the target surface in a regular pattern of scan lines and the maximum dose for a beam is determined by the brightness of the source and the speed of the scan. Unless the output of the source can be increased, a higher dose requires a slower scan to provide more time to deliver the dose to the target, and thus results in lower throughput of the system. In a vector scan lithography system, the scan speed and thus the dose of the charged particle beams may be controlled more flexibly, but at the cost of a more complex beam scanning system.

The use of more than one beam to write in the overlap areas 36 of the target will result in stitching errors in the overlap areas 36 if the beams are not perfectly aligned. These stitching errors add to the other types of errors to result in the overlap areas 36 having a higher CDu than the non-overlap areas 38. The insight underlying the invention is that using a higher exposure dose in the overlap areas will increase exposure latitude which will improve CDu in the overlap areas. Furthermore, exposure dose can be increased in the overlap areas without incurring a throughput penalty because there is more than one beam available to expose the overlap areas. In this way, stitching can be performed to deal with mis-alignment of the sub-areas while maintaining a CDu in the overlap areas which is comparable or better than the CDu in the non-overlap areas where there is no stitching.

Figure 11:
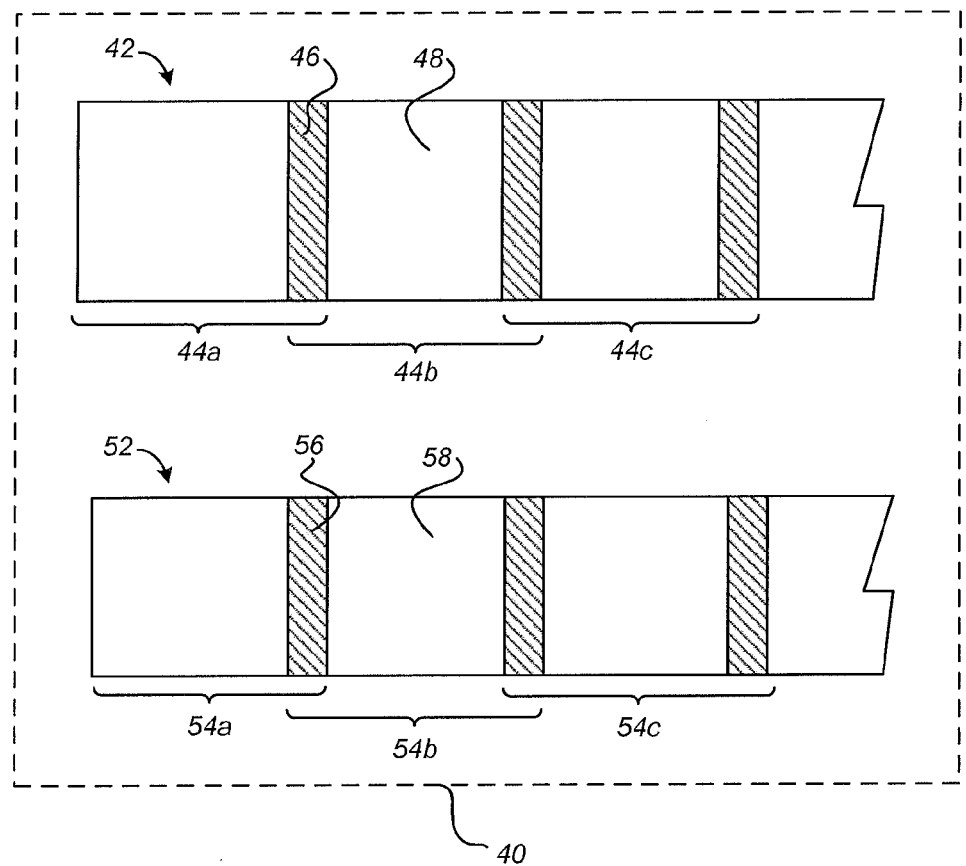
FIG. 11 is a representation of an exposure data file including pattern data and exposure dose data.

As mentioned above, the exposure data may include both pattern data and exposure dose data. FIG. 11 shows a data file of exposure data 40, including pattern data 42 and exposure dose data 52. The exposure dose data 52 may be represented separately from the pattern data 42, e.g. one portion of the exposure data file 40 may comprise pattern data 42 and a separate portion of the data file may comprise exposure dose data 52, e.g. in a dose map. Alternatively the pattern data 42 and exposure dose data 52 may be represented by combined data which encompasses both types of data, e.g. each feature represented in the pattern data 42 may include a dose value. The pattern data 42 comprises data describing the shapes of the features to be written onto the target 30, and the exposure data 52 comprises exposure dose values describing the exposure dose for the charged particle beams for exposing the features on the target 30.

The pattern data 42 is divided into a plurality of sub-sections 44, each comprising data describing the features to be exposed in a corresponding sub-area 34 of the target 30. The pattern data 42 includes overlap pattern data 46 describing the features to be exposed in an overlap area 36 on the target, and may also include non-overlap pattern data 48 describing the features to be exposed in a non-overlap area 38 on the target. Each sub-section 44 of pattern data may include overlap pattern data 46 and non-overlap pattern data 48.

The exposure dose data 52 is similarly divided into a plurality of sub-portions 54, each comprising exposure dose values to be used for exposing a corresponding sub-area 34 of the target 30. The exposure dose data 52 includes overlap dose data 56 comprising exposure dose values to be used for exposing an overlap area 36 on the target, and may also include non-overlap dose data 58 comprising exposure dose values to be used for exposing a non-overlap area 38 on the target. Each sub-portion 54 of exposure dose data may include overlap dose data 56 and non-overlap dose data 58.

In one embodiment, a sub-section 44 of the pattern data 42 is used for control of a single charged particle beam 24 to expose a particular sub-area 34 of the target 30. The overlap pattern data 46 may form part of more than one sub-section 44 of the pattern data 42, and be used to control more than one charged particle beam 24 for exposure of the overlap area 36 on the target. Similarly, a sub-portion 54 of the exposure dose data 52 may be used for control of a single charged particle beam 24 to expose a particular sub-area 34 of the target 30. The overlap dose data 56 may form part of more than one sub-portion 54 of the exposure dose data 52, and be used to control more than one charged particle beam 24 for exposure of the overlap area 36 on the target. Note that a sub-section 44 of the pattern data 42 and a sub-portion 54 of the exposure dose data 52 may instead be used for control of a group of charged particle beams 24 to expose a particular sub-area 34, and the same principles and details described herein also apply for a group of beams.

One or more of the features 60 to be exposed on the target 30, which are described by the pattern data 42, may lie partly or wholly within the overlap pattern data 46, representing features that are to be formed partly or wholly in an overlap area 36 on the target 30. Before exposing the target 30, the pattern data 42 describing these features or portions of features which are to be formed in an overlap area 36 may be processed to reduce the size of the features to be formed in the overlap area 36. For example, this processing may result in altering the overlap pattern data 46 so that the data describes the feature 60 with a reduced width.

Figure 13:
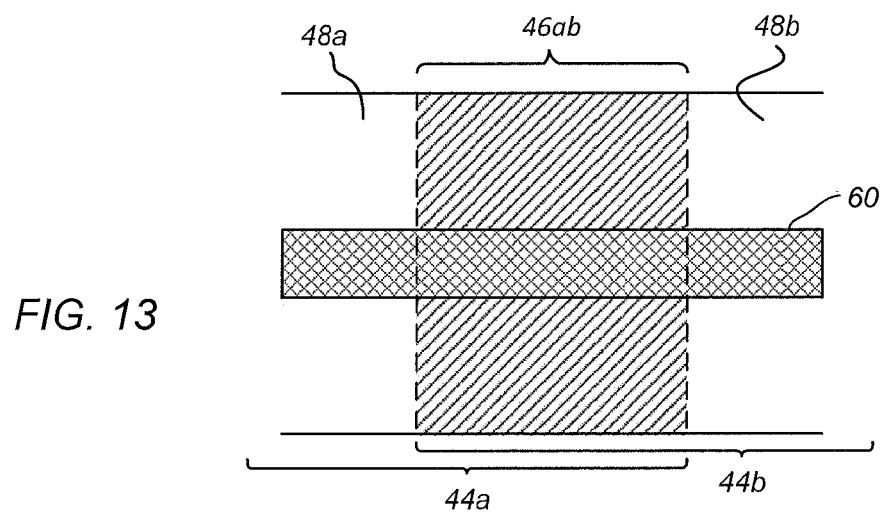
FIG. 13 is a representation of a feature described by pattern data.

FIG. 13 is a representation of a feature 60 described by pattern data 42 to be exposed onto target 30. Feature 60 is in the form of a rectangular shape which is described in sub-sections 44a and 44b of the pattern data 42 to be exposed in a sub-areas 34a and 34b respectively of the target. A first portion of the feature 60 is described in non-overlap pattern data 48a to be exposed in non-overlap area 38a of the target, a second portion is described in overlap pattern data 46ab to be exposed in overlap area 36ab of the target, and a third portion is described in non-overlap pattern data 48b to be exposed in non-overlap area 38b of the target.

Figure 14A:
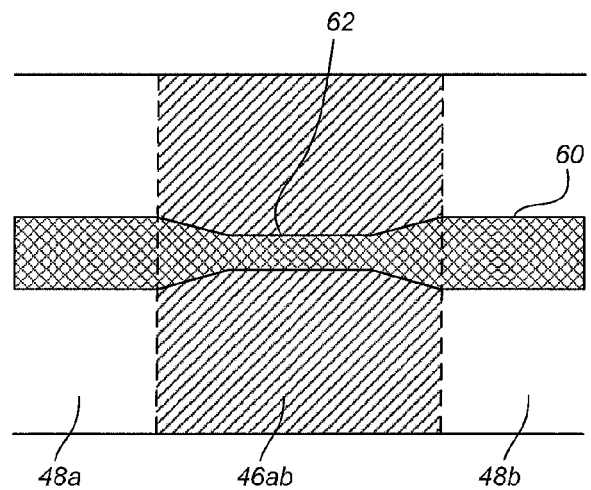
FIG. 14A is a representation of a feature described by pattern data after processing in a first embodiment.

FIG. 14A is a representation of feature 60 described by pattern data 42 after processing the overlap pattern data to prepare for exposure of the target 30, according to one embodiment. The processing of overlap pattern data 46ab results in modifying the data so that it describes the feature 60 with a reduced width in the overlap pattern data 46ab with respect to the width of the feature in the non-overlap pattern data 48a and 48b. The reduction of the width of the feature 60 in the overlap pattern data 46ab is a linear reduction over a portion of the data, resulting in a tapering of the width of the feature of a portion of the feature in the overlap area.

Figure 14B:
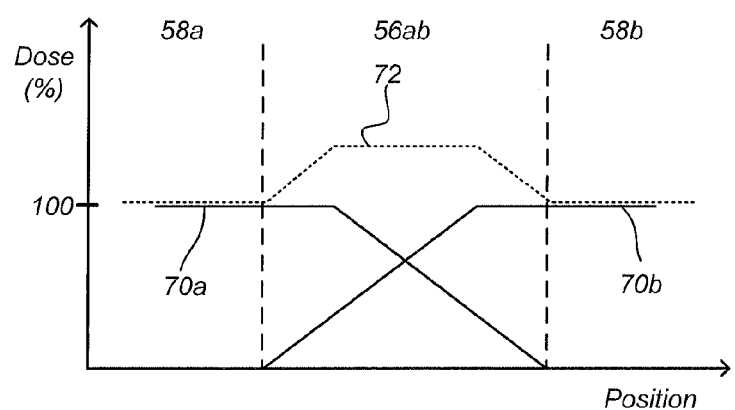
FIG. 14B is a representation of exposure dose values described by exposure dose data after processing in a first embodiment.

FIG. 14B is a representation of exposure dose values described by exposure dose data 52 after processing the overlap dose data to prepare for exposure of the target 30, according to one embodiment. The processing of overlap dose data 56ab results in modifying the data so that it describes exposure dose values for exposure of a corresponding overlap area 36ab of the target such that the exposure dose over at least a portion of the overlap area 36ab exceeds a maximum exposure dose in adjacent non-overlap areas 38a, 38b of the target.

As mentioned above, the overlap dose data 56 may be used to control more than one charged particle beam 24 for exposure of a corresponding overlap area 36 on the target. The actual resulting dose in an overlap area 36 is the sum of the dose imparted by each beam writing in the overlap area. Where two beams 24a, 24b write in adjacent sub-areas 34a, 34b on the target which overlap to form an overlap area 36ab on the target, the exposure data may include overlap dose data 56ab which describes exposure dose values for each of the two beams 24a, 24b for exposing the overlap area 36ab.

Figure 12:
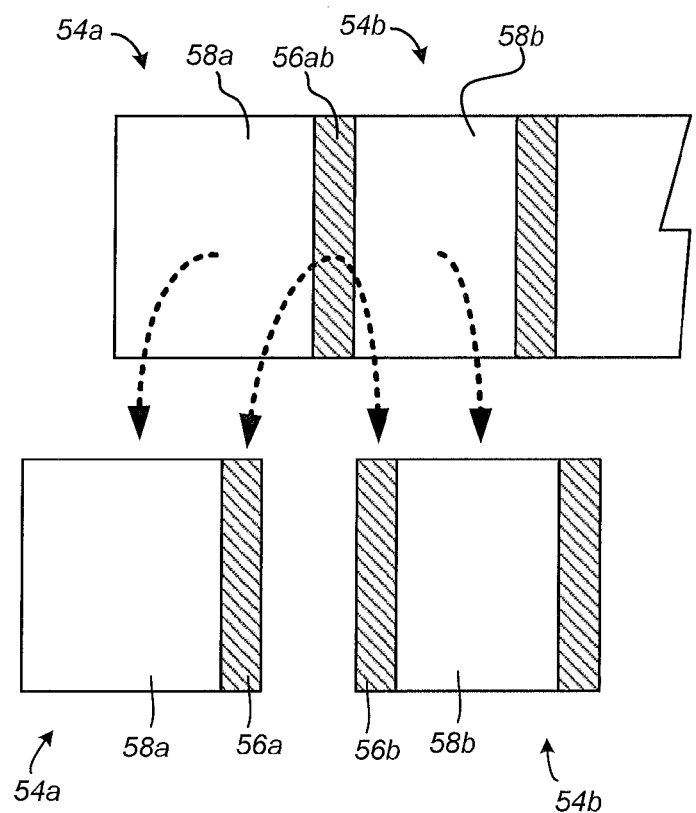
FIG. 12 is a diagram of an example of exposure dose data divided into sub-portions.

FIG. 12 illustrates an example of the processing of exposure dose data in this situation. The exposure dose data 52 includes exposure dose values for exposing the target 30, including non-overlap dose data 58a, overlap dose data 56ab, and non-overlap dose data 58b. The exposure dose data 52 is divided into sub-portions, including sub-portion 54a describing exposure dose for beam 24a to expose sub-area 36a and sub-portion 54b describing exposure dose for beam 24b to expose sub-area 36b. The overlap dose data 56ab is divided into overlap dose data 56a which describes exposure dose values for beam 24a to expose overlap area 36ab and overlap dose data 56b which describes exposure dose values for beam 24b to expose overlap area 36ab.

The processing of the overlap dose data results in modifying the two sets of overlap dose data 56a and 56b so that the sum of corresponding exposure dose values in the two sets of data is greater than exposure dose values for the non-overlap dose data 58a and 58b. In this way, the actual resulting dose in at least some portion of overlap area 36ab on the target is higher than the dose in non-overlap areas 36a and 36b, i.e. the exposure dose over at least a portion of the overlap area 36ab exceeds a maximum exposure dose in adjacent non-overlap areas 38a, 38b of the target.

Referring back to FIG. 14B, exposure dose values 70a to be used for beam 24a for exposing sub-area 36a on the target are shown, and exposure dose values 70b to be used for beam 24b for exposing sub-area 36b on the target. The horizontal axis represents position along a line through the sub-areas 36a and 36b on the target at which exposure dose data 52 describes the exposure values, and the vertical axis represents magnitude of the exposure dose values.

In the embodiment of FIG. 14B, the exposure dose of each beam is reduced in a linear variation in the overlap area in a complementary variation. The exposure dose 70a of beam 24a is set at a nominal 100% in non-overlap area 38a and remains at 100% in a first part of the overlap area 36ab and is then reduced linearly to zero dose at the edge of first sub-area 34a, i.e. at the end of overlap area 36ab. The exposure dose 70b of beam 24b follows a mirror image of this variation, with 100% dose in a first part of the overlap area 36ab and being reduced linearly to zero dose at the edge of second sub-area 34b. The resulting combined dose 72 in the overlap 36ab, resulting from the combined dose 70a and 70b at each point within the overlap area 36ab, exceeds the nominal 100% dose used in the non-overlap areas 38a, 38b.

At least a portion of the dose values in the overlap dose data 56a vary in dependence upon their corresponding writing position within the overlap area 36ab, decreasing in magnitude with increasing distance of their corresponding writing position from the edge of overlap area 36ab next to non-overlap area 38a. In a mirror image of this variation, at least a portion of the dose values in the overlap dose data 56b vary in dependence upon their corresponding writing position within the overlap area 36ab, increasing in magnitude with reducing distance of their corresponding writing position from the edge of overlap area 36ab next to non-overlap area 38b.

In this way the exposure dose 70a decreases (fades out) as beam 24a scans across the overlap area 36ab towards the edge of sub-area 34a, while the exposure dose of beam 24b increases (fades in) as it scans across the overlap area 36ab starting from the edge of neighbouring sub-area 34b. Note that not all of the dose values in the overlap dose data 56a and 56b are reduced. In this embodiment, the variation in the dose values 70a, 70b and the variation in the feature size 62 is linear with respect to writing position within the overlap area 36ab over at least a portion of the overlap area, while there is no variation in dose values over another portion of the overlap area. Other variations may also be used as described below.

At each position in overlap area 36ab of the target, the reduced width of the feature 60 described by the overlap pattern data 46ab is related to (e.g. it may be proportional to) the amount by which the sum 72 of exposure dose values 70a, 70b exceeds a maximum exposure dose value used in the non-overlap areas 38a, 38b of the target. As the combined exposure dose 72 increases the width of the feature 60 is reduced, when the combined exposure dose 72 remains constant the width of the feature 60 also remains constant, and as the combined exposure dose 72 is reduced the width of the feature 60 increases. The reduced feature size and increased exposure dose in the overlap area balance each other to resolve the feature with the desired size, but with improved exposure latitude.

Figure 14C:
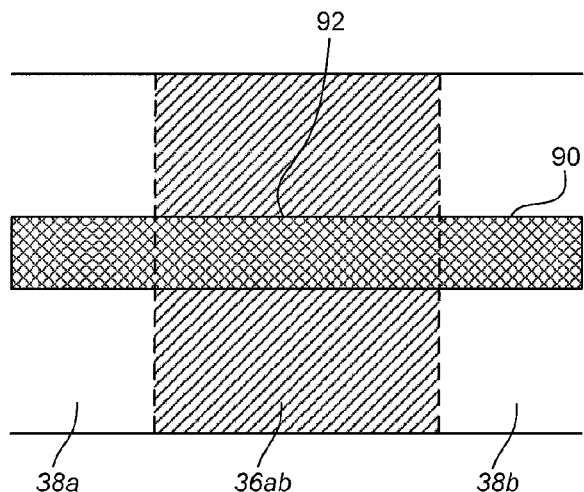
FIG. 14C illustrates a feature is resolved in the resist on the surface of target in accordance with the modified pattern data and exposure dose data according to FIGS. 14A and 14B.

FIG. 14C illustrates the feature 90 as it is resolved in the resist on the surface of target 30 by beams 24a, 24b in accordance with the modified pattern data and exposure dose data according to FIGS. 14A and 14B. The portion 92 of feature 90 in the overlap area 36ab is resolved with the same width as in the non-overlap areas 38a, 38b of the target. The reduced size of the feature 60 in the overlap area as described in the pattern data 42 is compensated by the higher exposure dose 72 in the overlap area as described in the exposure dose data 52. These two adjustments to the exposure data 40 are preferably implemented such that the resolved pattern in the overlap areas after development of the resist exhibits the desired dimensions of features in the overlap areas.

The processing of the exposure data 40 to reduce a size of one or more features 60 described by the overlap pattern data 46 and the corresponding increase in exposure dose values described by the overlap dose data 56 results in exposure of the features at the desired dimensions, but with increased exposure latitude. The stitching in the overlap areas 36 causes CDu errors due to errors in the stitching, and these stitching errors are not present in the non-overlap areas 38 where there is no stitching. However, the improved exposure latitude in the overlap areas 36 results in an improvement in all of the CDu errors so that the net result is that the CDu in the overlap areas 36 is comparable or better than the CDu in the non-overlap areas 38.

Figure 15A:
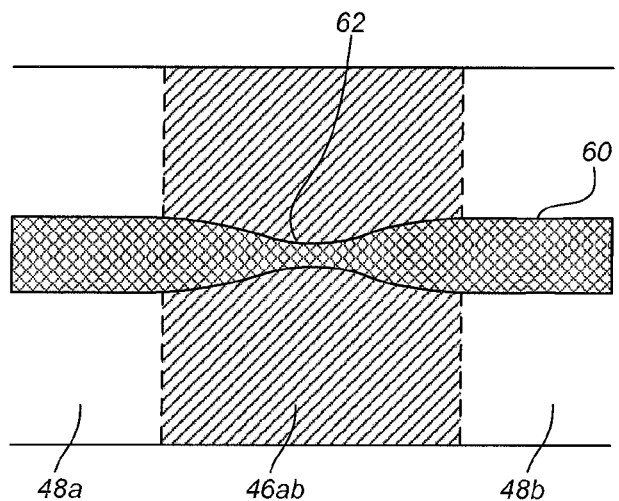
FIG. 15A is a representation of a feature described by pattern data after processing in a second embodiment.
Figure 15B:
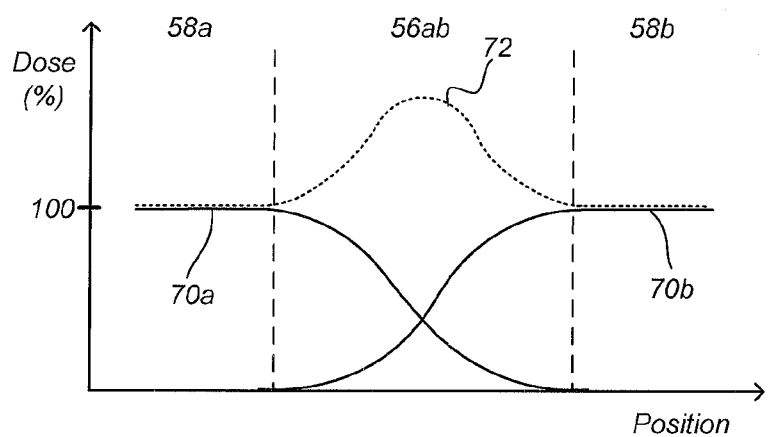
FIG. 15B is a representation of exposure dose values described by exposure dose data after processing in a second embodiment.
Figure 15C:
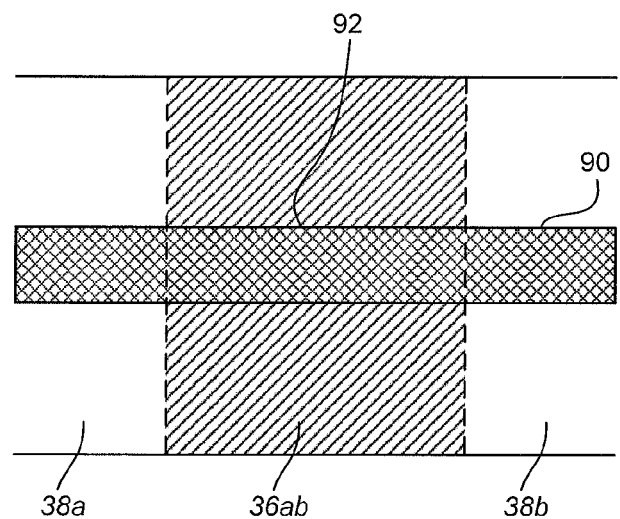
FIG. 15C illustrates a feature is resolved in the resist on the surface of target in accordance with the modified pattern data and exposure dose data according to FIGS. 15A and 15B.

FIGS. 15A-15C illustrate another embodiment which is analogous to the one shown in FIGS. 14A-14C but with a sinusoidal variation in the pattern data and a corresponding sinusoidal variation in the exposure dose values. FIGS. 15A and 15B are representations of feature 60 described by pattern data 42 and exposure dose values described by exposure dose data 52 after processing the overlap dose data to prepare for exposure of the target 30. FIG. 15C illustrates feature 90 as it is resolved in the resist on the surface of target 30 by beams 24*a*, 24*b* in accordance with the modified pattern data and exposure dose data according to FIGS. 15A and 15B.

In this embodiment, the variation in the dose values 70*a*, 70*b* and the variation in the feature size 62 is sinusoidal with respect to writing position within the overlap area 36*ab* over at least a portion of the overlap area. Other variations are also possible, preferably the dose values 70*a*, 70*b* and feature size 62 varying with respect to writing position within the overlap area 36*ab* over at least a portion of the overlap area.

It is preferred that the combined exposure dose values 72 increase in the overlap area with a slope (in a dose versus position plot such as FIG. 15B) close to zero and increasing gradually (with a corresponding modification of the feature dimensions in the pattern data). The sinusoidal variation shown in FIG. 15B exhibits this, and other functions with a similar property may also achieve good results. As the dose 72 increases in the overlap area, the exposure latitude increases and stitch error, given by the slope of the dose versus position plot, can be better compensated for.

As described above for the embodiment of FIGS. 14A-14C, the processing of the exposure data 40 to linearly reduce feature size and increase exposure dose for the overlap areas results in exposure of the features at the desired dimensions but with increased exposure latitude. The sinusoidal or similar variation in feature size and exposure dose provides improved exposure latitude as the exposure dose increases to provide better CDu in the overlap areas.

The dose values of the exposure dose data is used to vary the exposure dose imparted by each charged particle beam to the resist on the target. The lithography system may include means for varying the exposure dose, such as a variable intensity charged particle source. However, the exposure dose is preferably varied by switching individual beams on and off to achieve a certain mark-space ratio which results in the desired exposure dose for the beams. This switching may be accomplished for example by the blanker array and beam stop array such as shown in FIG. 1. An example of dithering is described in U.S. patent application publications 2012-0286169 and 2012-0286170 of the present applicant, which are hereby incorporated by reference in their entirety.

Thus, it will be recognized that these embodiments are susceptible to various modifications and alternative forms without departing from the spirit and scope of the invention. Accordingly, although specific embodiments have been described, these are examples only and are not limiting upon the scope of the invention, which is defined in the accompanying claims.

What is claimed is:

1. Method for processing exposure data for exposing a pattern on a target by multiple beam lithography using a plurality of charged particle beams, each beam scanning a sub-area of the target, the exposure data comprising exposure dose data describing exposure dose of the charged particle beams and pattern data representing one or more features to be written on the target, the method comprising:
   dividing the pattern data into a plurality of sub-sections, each of the sub-sections comprising pattern data describing a part of the pattern to be written in a corresponding sub-area of the target, wherein the pattern data comprises overlap pattern data describing a part of the pattern to be written in a corresponding overlap area of the target where adjacent sub-areas overlap;
   setting one or more dose values of the exposure dose data such that a sum of dose values corresponding to a position in an overlap area of the target exceeds a maximum dose value for the non-overlap areas of the target where adjacent sub-areas do not overlap; and
   processing the overlap pattern data to reduce a size of one or more features described by the overlap pattern data, wherein the higher exposure dose in the overlap area is compensated by the reduction in size of the features in the overlap area.

2. The method of claim 1, wherein a first one of the sub-sections of pattern data corresponds to a first one of the sub-areas, and a second one of the sub-sections of pattern data corresponds to a second one of the sub-areas, and each of the first and second sub-sections include overlap pattern data corresponding to an overlap area of the first and second sub-area.

3. The method of claim 1, wherein the pattern data describes a feature having a width, the feature being comprised partly in the overlap pattern data and partly in non-overlap pattern data, and wherein the processing of the overlap pattern data results in reducing the width of the feature in the overlap pattern data with respect to the width of the feature in the non-overlap pattern data.

4. The method of claim 1, wherein the processing of the overlap pattern data results in a dimension of the one or more features being smaller in the overlap pattern data than in non-overlap pattern data of the pattern data.

5. The method of claim 1, wherein the step of setting one or more of the dose values of the exposure dose data comprises generating two sets of dose values for each overlap area of the target, each dose value in one set having a corresponding dose value in the other set, wherein the sum of the corresponding dose values in the two sets for at least some of the dose values exceeds a maximum dose value for the non-overlap areas of the target where adjacent sub-areas do not overlap.

6. The method of claim 1, wherein the reduction in size of the one or more features described by the overlap pattern data is related to the amount by which a sum of exposure dose values corresponding to a position in an overlap area of the target exceeds a maximum exposure dose value for the non-overlap areas of the target.

7. The method of any one of claim 1, wherein the reduction in size of the one or more features described by the overlap pattern data is proportional to the amount by which a sum of exposure dose values corresponding to a position in an overlap area of the target exceeds a maximum exposure dose value for the non-overlap areas of the target.

8. The method of claim 5, wherein the reduction in size of the one or more features described by the overlap pattern data is calculated from the sum of the corresponding dose values in the overlap area in combination with the desired size of the feature after development of a resist present on the target, the resist layer adapted to be exposed by the charged particle beams.

9. The method of claim 1, wherein the exposure dose data is divided into a plurality of sub-portions, each of the sub-portions including exposure dose values for exposing a corresponding sub-area of the target, wherein the exposure dose data comprises overlap dose values describing exposure dose for a corresponding overlap area of the target where adjacent sub-areas overlap, and non-overlap dose values describing exposure dose for corresponding non-overlap areas of the target where adjacent sub-areas do not overlap.

10. The method of claim 1, wherein a first sub-portion of exposure dose data corresponds to a first one of the sub-areas, and a second sub-portion of exposure dose data corresponds to a second one of the sub-areas, and each of the first and second sub-portions include overlap dose values corresponding to an overlap area of the first and second sub-area.

11. The method of claim 1, further comprising:
    identifying a first sub-portion of the exposure dose data corresponding to a first one of the sub-areas of the target;
    identifying a second sub-portion of the exposure dose data corresponding to a second one of the sub-areas of the target;
    generating first overlap dose data having a plurality of dose values each corresponding to a writing position in an overlap area of the target in which the first and second sub-areas overlap, wherein at least a portion of the dose values vary in dependence upon their corresponding writing position within the overlap area, the dose values decreasing in magnitude with increasing distance of their corresponding writing position from the part of the first sub-area outside of the overlap area; and
    generating second overlap dose data having a plurality of dose values each corresponding to a writing position in the overlap area of the target, wherein at least a portion of the dose values vary in dependence upon their corresponding writing position within the overlap area, the dose values decreasing in magnitude with increasing distance of their corresponding writing position from the part of the second sub-area outside of the overlap area.

12. The method of claim 11, wherein the variation in the dose values of the first and second overlap dose data is a linear variation in dependence on corresponding writing position of the dose values over at least a portion of the writing positions.

13. The method of claim 11, wherein the variation in the dose values of the first and second overlap dose data is a sinusoidal variation in dependence on corresponding writing position of the dose values over at least a portion of the writing positions.

14. The method of claim 1, wherein the dose values of the exposure dose data comprise dithering values for dithering the beams.

15. The method of claim 1, wherein the method is adapted for processing exposure data for exposing a pattern on a target by raster scanning the plurality of charged particle beams over the target.

16. Method for exposing a target using plurality of charged particle beams according to exposure data, the exposure data comprising pattern data representing one or more features to be written on the target and exposure dose data representing an exposure dose of the charged particle beams, the method comprising:
    processing the exposure data according to the method of claim 1; and
    exposing the target using the charged particle beams controlled in accordance with the processed exposure data, wherein each charged particle beam scans a sub-area of the target.

17. The method of claim 16, further comprising:
    assigning a first one of the charged particle beams for exposing a first sub-area of the target and assigning a second one of the charged particle beams for exposing a second sub-area of the target, wherein the first and second sub-areas are adjacent and overlap in an overlap area;
    exposing the first sub-area of the target using the first charged particle beam in accordance with a first portion of the processed exposure data; and
    exposing the second sub-area of the target using the second charged particle beam in accordance with a second portion of the processed exposure data.

18. A charged particle multiple beam lithography system for exposing a target using a plurality of charged particle beams, the system comprising:
    a charged particle generator adapted for generating the charged particle beams;
    a modulation system configured to modulate the charged particle beams in accordance with exposure data;
    a deflection system adapted to deflect the charged particle beams for scanning the beams over the surface of the target;
    a projection lens system adapted to project the charged particle beams onto the target;
    a moveable stage for holding the target; and
    one or more control units configured to control the modulation system, the deflection system, and the stage to expose the target;
    wherein the lithography system is adapted for processing the exposure data for exposing a pattern on the target in accordance with the method of claim 15.

19. The system of claim 18, wherein the modulation system comprises a beamlet blanker array and beam stop array for switching on and off individual beams of the plurality of charged particle beams.

20. The system of claim 18, wherein the modulation system is adapted to adjust an exposure dose of the charged particle beams in accordance with exposure dose data.

21. The system of claim 18, wherein the modulation system is adapted to adjust an exposure dose of the charged particle beams by dithering the charged particle beams in accordance with the exposure dose data.

22. The system claim 18, wherein the modulation system is adapted to switch the charged particle beams on or off in accordance with pattern data.

* * * * *